United States Patent [19]

Essig et al.

[11] Patent Number: 4,745,629

[45] Date of Patent: May 17, 1988

[54] DUTY CYCLE TIMER

[75] Inventors: Thomas W. Essig; Rajendra K. Shah, both of Fort Wayne, Ind.

[73] Assignee: United Technologies Corporation, Hartford, Conn.

[21] Appl. No.: 61,600

[22] Filed: Jun. 19, 1987

Related U.S. Application Data

[63] Continuation of Ser. No. 932,769, Sep. 26, 1986, abandoned, which is a continuation of Ser. No. 586,935, Mar. 7, 1984, abandoned.

[51] Int. Cl.$^4$ .................. H03K 17/296; H03K 17/28; H03K 21/38; F25D 21/06

[52] U.S. Cl. ......................... 377/20; 377/44; 377/55; 377/56; 377/110; 328/130.1; 307/265; 307/602; 307/603; 361/196; 62/80; 62/155

[58] Field of Search ............... 377/20, 55, 56, 44, 377/107, 110, 109; 328/129.1, 130.1, 58, 61; 361/196; 307/265, 597, 608; 62/80, 155, 157

[56] References Cited

U.S. PATENT DOCUMENTS

| | | | |
|---|---|---|---|
| 3,096,483 | 7/1963 | Ransom | 377/110 |
| 3,375,449 | 3/1968 | Ribour et al. | 377/107 |
| 3,657,658 | 4/1972 | Kubo | 328/61 |
| 3,678,398 | 7/1972 | Thomenius | 377/110 |
| 3,697,879 | 10/1972 | Holliday | 328/61 |
| 3,805,167 | 4/1974 | Nash et al. | 328/61 |
| 3,854,915 | 12/1974 | Schulze-Berg et al. | 62/155 |
| 3,890,798 | 6/1975 | Fujimoto et al. | 62/155 |
| 4,056,948 | 11/1977 | Goodhouse | 62/155 |
| 4,104,888 | 8/1978 | Reedy et al. | 62/80 |
| 4,132,085 | 1/1979 | Maio et al. | 62/155 |
| 4,142,374 | 3/1979 | Ansted et al. | 62/155 |
| 4,151,723 | 5/1979 | Gardner | 62/155 |
| 4,156,350 | 5/1979 | Elliott et al. | 62/80 |
| 4,173,871 | 11/1979 | Brooks | 62/80 |
| 4,209,994 | 7/1980 | Mueller et al. | 62/155 |
| 4,251,988 | 2/1981 | Allard et al. | 62/80 |
| 4,251,999 | 2/1981 | Tanaka | 62/155 |
| 4,254,633 | 3/1981 | Murakami et al. | 62/155 |
| 4,297,852 | 11/1981 | Brooks | 62/153 |
| 4,299,095 | 11/1981 | Cassarino | 62/155 |
| 4,302,947 | 12/1981 | Mueller et al. | 62/155 |
| 4,316,365 | 2/1982 | Mueller et al. | 62/151 |
| 4,327,556 | 5/1982 | Zampini et al. | 62/153 |
| 4,327,557 | 5/1982 | Clarke et al. | 62/153 |
| 4,328,680 | 5/1982 | Stamp, Jr. et al. | 62/155 |
| 4,330,751 | 5/1982 | Swain | 328/61 |
| 4,332,141 | 6/1982 | Mueller et al. | 62/140 |
| 4,344,294 | 8/1982 | Gelbard | 62/155 |
| 4,358,933 | 11/1982 | Horvay | 62/155 |
| 4,373,349 | 2/1983 | Mueller | 62/156 |
| 4,384,461 | 5/1983 | Kurtz | 62/157 |
| 4,395,887 | 8/1983 | Sweetman | 62/155 |
| 4,417,452 | 11/1983 | Ruminsky et al. | 62/155 |
| 4,474,024 | 10/1984 | Eplett et al. | 62/140 |
| 4,481,785 | 11/1984 | Tershak et al. | 62/153 |
| 4,496,305 | 1/1985 | Bentz | 431/1 |
| 4,499,738 | 2/1985 | Motoyama et al. | 62/155 |

OTHER PUBLICATIONS

Timing Modules by American Control Products, Division of Precision Timer Company dated Dec. 6, 1982 (four pages).

Specification and Outline, Electronic Control Model 990-197 Heat Pump Control, from Hamilton Standard Controls, Inc. (three pages).

*Primary Examiner*—John S. Heyman

[57] ABSTRACT

An improved duty cycle timer provides a duty cycle control signal having alternate "on" and "off" intervals of different logic states. The timer utilizes integrated circuitry having first and second independent clock sources respectively driving first and second multistage, binary counters. One counter measures the "off" interval and the other counter measures the "on" interval. Each counter provides a signal representative of the completion of the interval which it measures, and that signal is connected to a resetting input of the opposite counter for initiating the measuring interval of that opposite counter. Typically, one interval is longer than the other. The duty cycle control signal is provided by the output of one of the counters. In an illustrated embodiment, the duty cycle timer controls operation of a defrost mechanism for a refrigeration circuit and the "off" interval is longer than the "on" interval. Associated "hold" circuitry is operative to suspend operation of the duty cycle timer when some particular demand is satisfied, but resumes operation of the timer from where it stopped when the particular demand returns.

14 Claims, 4 Drawing Sheets

DUTY CYCLE TIMER

This is a continuation of application Serial No. 932,769 filed on Sept. 26, 1986 and now abandoned, which is a continuation of application Ser. No. 386,935 filed on Mar. 7, 1984, and now abandoned.

TECHNICAL FIELD

The invention relates to electrical control circuitry and more particularly to an improved timer. More specifically still, the invention relates to an improved duty cycle timer usable, for example, in a defrost control circuit.

BACKGROUND ART

A variety of timers exist for controlling the operating duty cycle of different types of load devices. One such representative type of load comprises the defrost mechanisms for various refrigeration circuits in which there are alternate "on" and "off" intervals of operation. Typically the control functions which may affect a defrosting operation in a refrigeration system include discontinuance of fan motor operation and/or reversal of the coolant flow valve and/or energization of a resistive heating element. In any event, the duty cycle is controlled by a duty cycle timer which, during the "off" interval, does not operatively energize the various defrost mechanisms and which, during the "on" interval does operate those defrost mechanisms. Various control philosophies dictate, to a certain extent, the type of defrost control timer or duty cycle timer which might be employed.

For instance, in some systems the load, such as a defrost mechanism, may not be energized unless and until some sort of sensing device determines its need. For instance, with a defrost mechanism the sensor may detect ice buildup. In some such instances, the defrost mechanism may be made operative only upon detection of the ice buildup and may then be maintained operative either for a predetermined interval or until a sensor determines that the triggering condition has abated. In other instances, which may not employ such a sensor, the defrost mechanisms may be maintained inoperative for a predetermined interval and then actuated to provide the defrost function for a second predetermined interval. It is to this latter type of load control philosophy that the present invention applies.

Specifically, the duty cycle timer is required to measure a predetermined "off", or inoperative, interval and to then effect turn-on of the load device and measure a second predetermined "on" interval following which the load is again turned off. In certain instances where the refrigeration condition which might lead to the defrost condition is itself satisfied, as by meeting the setsetting of a room temperature thermostat, some further provision may be made for halting or "holding" the count then registered by the timer during the particular "off" or "on" interval.

One form of timer often used in duty cycle timing is illustrated in U.S. Pat. No. 4,327,556. A timer motor driven by 60 Hz line voltage determines the duration of at least the "on" interval of the duty cycle and might also be used for determining the "off" interval. The cost of such timer motor may be significant in a control system of that sort.

With the advent of reliable, relatively low cost electronic devices, the utilization of electronic duty cycle timers has increased significantly. Typically, a single source of clock signals, for instance provided by an oscillator or 60 Hz line frequency, is utilized to drive one or more multistage electronic counters. In those instances in which only one of the two "off" and "on" intervals is to be timed, a single, multistage electronic binary counter is typically used. Where both the "off" interval and the "on" interval are to be timed, it is conventional for a single clock signal to drive either two separate "on" and "off" counters or a single multistage counter which determines both the "on" and the "off" intervals by signal outputs from a plurality of the stages of the multistage counter. In this latter instance, decoding logic may be utilized to decode the outputs of the counter stages. U.S. Pat. No. 3,890,798 discloses an electronic timer having first, second and third counters in which clock signals are applied to the input stage of the first counter and its outputs are utilized to drive the second and third counters.

A limitation with such systems is the dependence of both the "on" and the "off" intervals on a single clock source. Such dependence necessarily means that the "off" interval and the "on" interval are dependent upon one another as some binary function of the frequency of the clock source. Such interdependence may not be desirable, particularly where it necessitates extensive use of logic gating to decode various stages of a multistage counter to provide both the "on" and the "off" intervals. Disclosure of Invention It is an object of the invention to provide an economical and relatively flexible duty cycle timer for controlling the duration of "off" and "on" intervals of a control signal. Included within this object is the provision of such an improved duty cycle timer suitable for use in controlling the defrost mechanism associated with a refrigeration circuit.

It is a further object of the present invention to provide an improved duty cycle timer which, when interrupted in its timing function, is capable of retaining the accumulated time-count and resuming the timing function therefrom.

In accordance with the present invention there is provided an improved duty cycle timer which provides a duty cycle control signal having alternate, complementary "on" and "off" intervals. The "on" and "off" intervals of the control signal are typically represented by different logic states. The timer utilizes integrated circuitry for providing first and second independent clock signals which respectively drive first and second electronic counters. One counter is used for determining the "off" interval and the other counter is used for determining the "on" interval. Completion of the count by each respective counter signifies completion of the respective duty cycle interval, and the respective outputs are cross-connected to the alternate counter to initiate the subsequent counting sequence by that alternate counter.

Although the "off" and the "on" intervals may be of equal duration, typically they are different. A singular duty cycle control signal having both "off" and "on" intervals is provided by output of a predetermined, i.e., final, stage of one of the counters. In an exemplary embodiment, the interval measured by the first electronic counter is longer than the interval measured by the second electronic counter, both counters have the same number of operative stages, the first clock is at a lower repetition rate than the second clock and the duty cycle control signal is provided by the final stage of the first counter.

In the illustrated embodiment, the first clock and first counter are incorporated in one integrated circuit chip and the second clock and second counter are incorporated in a second integrated circuit chip. Each of the counters may be reset by the output signal from the final stage of the opposite counter. The connection of selected values of resistance and capacitance to the respective integrated circuits determines the respective frequency of the respective clock.

The duty cycle control signal may be extended to the control electrode of an electronic switch for controlling the flow of electrical current to a load device, as for instance the defrosting mechanism associated with a refrigeration circuit. Further, operation of the first and second clock sources may be inhibited by an appropriate "hold" signal to interrupt the counting operation yet allow maintenance of the accumulated count in the respective counters. Circuitry is provided for converting the presence or absence of an AC signal, as from a thermostat, into a corresponding "enable or hold" logic level to respectively enable or inhibit operation of one or both of the clock sources.

BEST MODE FOR CARRYING OUT THE INVENTION

Figure 1:
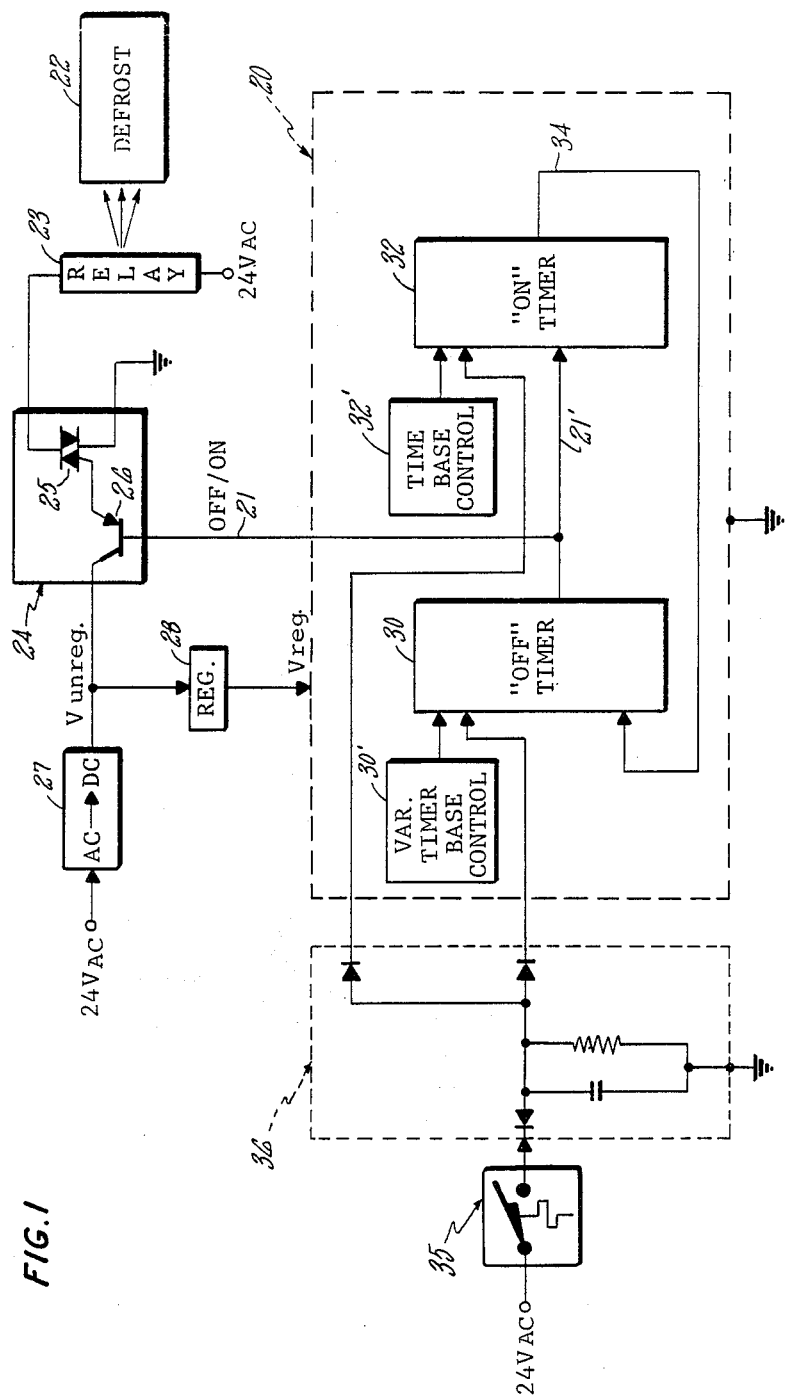
FIG. 1 is a functional block diagram showing the duty cycle timer in operative association with a defrost mechanism in accordance with an embodiment of the invention.

Referring to FIG. 1 there is illustrated in general block diagram form, an electronic duty cycle timer 20 for providing a duty cycle control signal on line 21, to control the duty cycle of operation of a defrost mechanism generally represented by block 22. The defrost mechanism 22 is included as part of a refrigeration circuit (not shown), and may include a fan, a coolant flow reversing valve and/or a heating element, the operation of each of which is controlled by respective contactors which are controlled by a relay 23. The relay is connected to a 24 volt AC supply by an electronic switch, generally designated 24, which controls its energization. The switch 24 includes a triac 25 having its control electrode connected, via an intermediate transistor 26, to the duty cycle control signal appearing on line 21. The collector of transistor 26 is connected to a source of DC voltage ($-24V_{unreg}$), which is derived from a 24 volt AC supply by the rectification and filtering circuitry generally designated 27.

Appropriate regulation circuitry 28 converts the $-24V_{unreg}$ DC supply to a regulated $-15$ volt supply $V_{reg}$ is provided to the electronic elements associated with duty cycle timer 20. The duty cycle control signal appearing on line 21 alternates between the logic 1 and the logic 0 state, the former being at ground potential and the latter being at $-15$ volts. As used in the illustrated embodiment, the logic 1 state represents the "off" interval and, through its connection to the base of transistor 26, makes the transistor nonconducting and thus causes the control electrode on triac 25 to render the triac nonconductive during that interval. During the "on" interval, the $-15$ volt signal on the base of transistor 26 causes the transistor to conduct and thus causes the control electrode of triac 25 to render the triac conductive, thereby actuating the relay 23.

According to the control philosophy for the defrost mechanism 22, the associated refrigeration circuit (not shown) is intended to operate for a predetermined interval during which the defrost mechanism remains "off" and is followed by a predetermined interval during which the defrost mechanism is "on". In the exemplary embodiment, the defrost mechanism 22 is associated with a heat pump and the "off" interval might be selected to be 30, 60 or 90 minutes, with the "on" interval being about 10 minutes. The duty cycle timer 20 is thus structured such that the "off"/"on" duty cycle signal appearing on lead 21 may have an "off" interval of 60 (minutes) (or 30 minutes or 90 minutes) and an "on" interval of 10 minutes.

Referring to the generalized functional block diagram of FIG. 1, the "off" interval is determined by an "off" timer 30 and the "on" interval is determined by an "on" timer 32. Each of the timers 30 and 32 includes its own independent oscillator as will be discussed in greater detail with reference to FIGS. 2 and 3. Control of the time base for the oscillators of timers 30 and 32 is provided by time base control elements 30' and 32' respectively, the former being illustrated as being variable to afford adjustment of the frequency of the oscillator in the field to thereby adjust the length of the "off" interval. The output of the "off" timer 30 is extended, via lead 21', to the "on" timer 32 such that competion of the "off" interval serves to initiate timing of the "on" interval. Similarly, an output from the "on" timer 32 is extended via lead 34 to the "off" timer 30 such that a signal generated by completion of the "on" interval serves to initiate timing of the "off" interval.

Referring further to FIG. 1, the exemplary control philosophy for the defrost mechanism 22 further provides for interrupting the duty cycle timer 20 in the event the associated refrigeration circuit is itself interrupted. For instance, if a room temperature sensor, such as thermostat 35, indicates that a demand has been satisfied and the refrigeration circuit may terminate its cooling or heating operation, it acts through a "hold" circuit 36 to similarly disable the duty cycle timer 20. In accordance with an aspect of the invention, the present duty cycle timer 20 is disabled, or "held", in a manner which "holds" the accumulated count (or time) and resumes at that point when the thermostat 35 signifies that operation of the refrigeration circuit is to resume.

Figure 2:
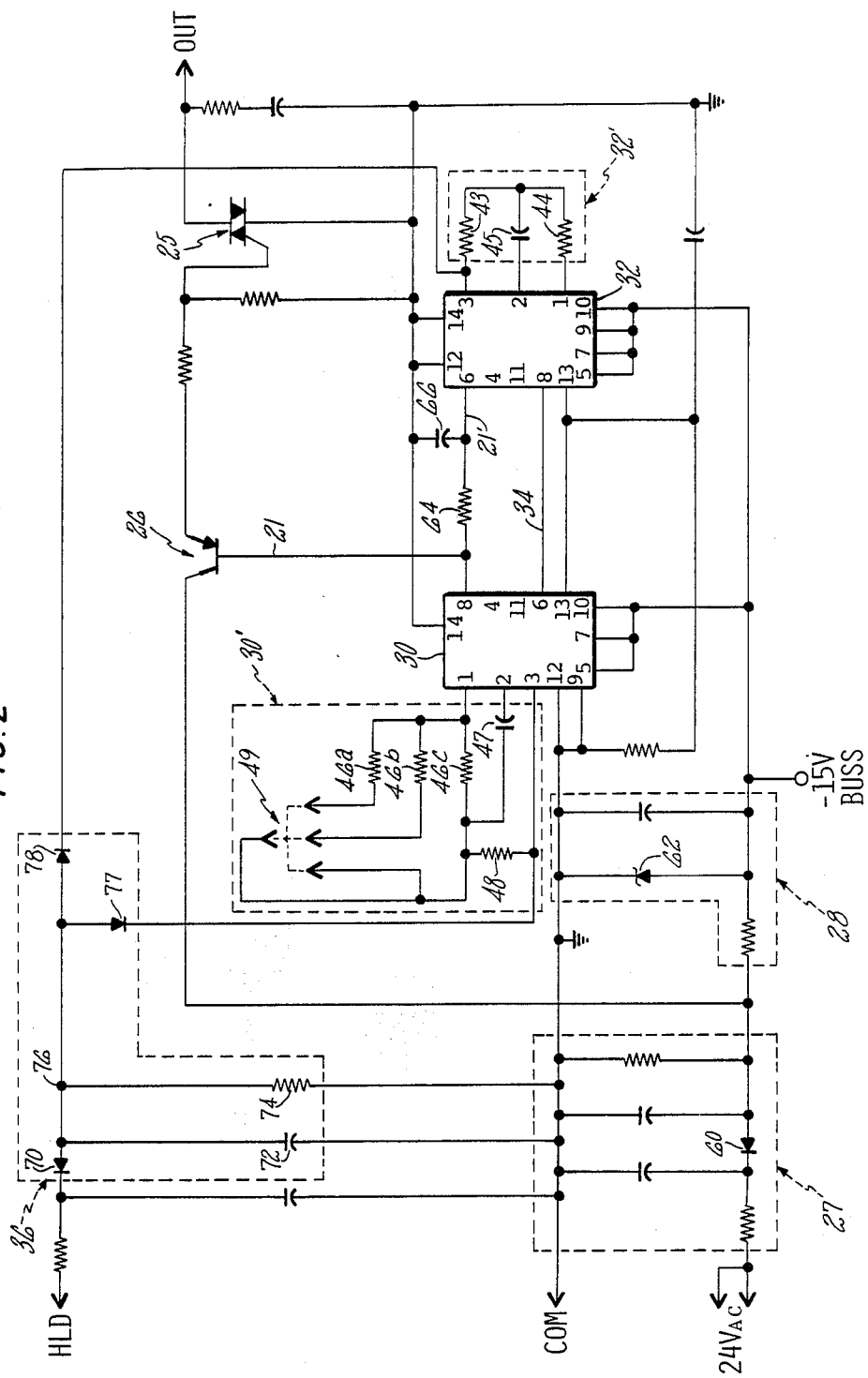
FIG. 2 is an electrical circuit diagram illustrating the duty cycle timer of FIG. 1 in greater detail.
Figure 3:
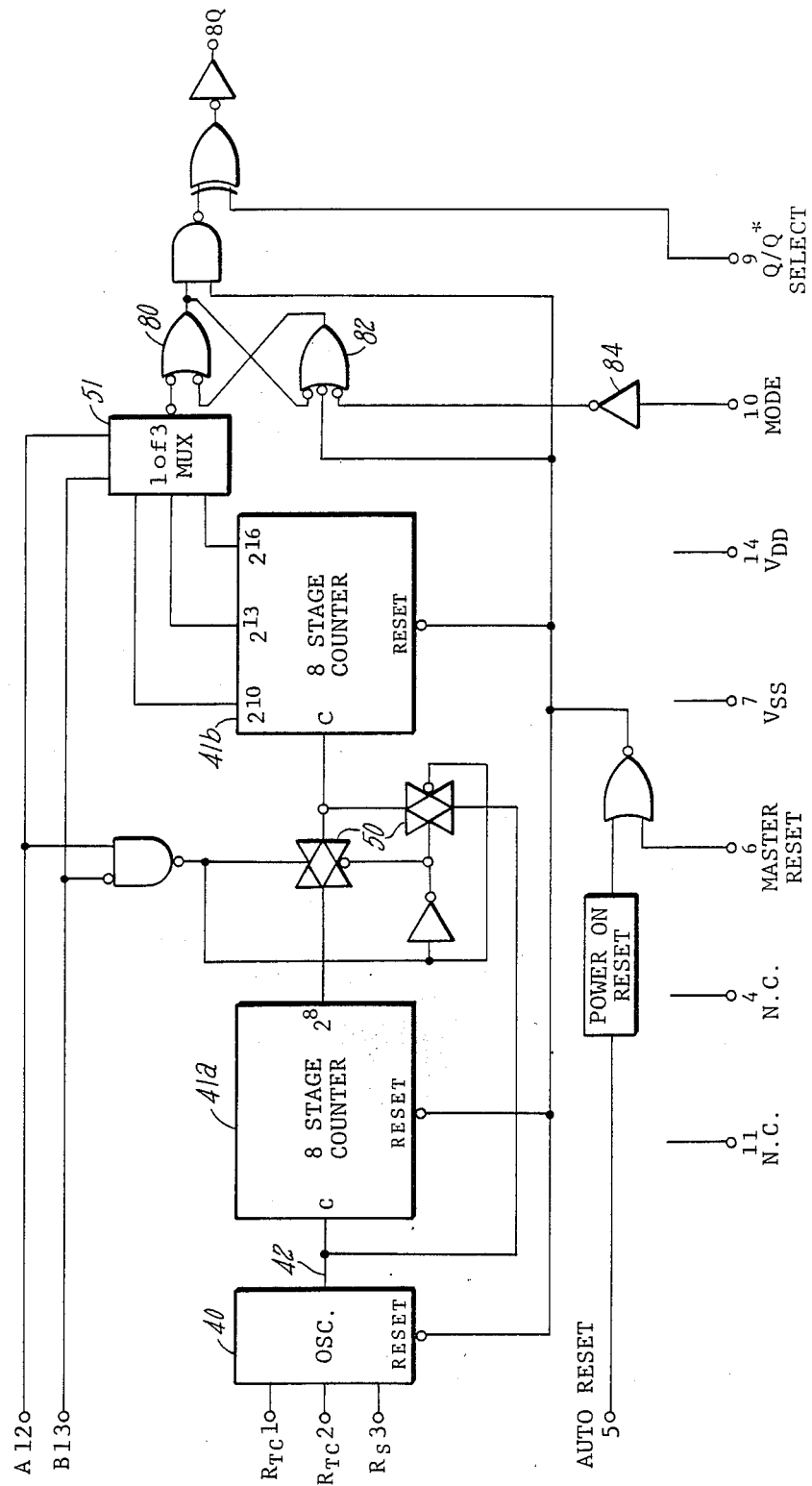
FIG. 3 is a detailed block diagram of one of the pair of oscillator/counter integrated circuits illustrated in generalized block form in FIG. 2.

Referring now to FIGS. 2 and 3, the circuitry of the duty cycle timer 20 and its associated "hold" circuit 36 are depicted in greater detail, as will be hereinafter described. The "off" timer 30 consists of an oscillator and a multistage binary counter, with the oscillator providing clock pulses at a predetermined frequency to drive the counter. The "on" timer 32 also includes an oscillator and a multistage binary counter, with its oscillator being separate from that for the "off" timer 30 and serving to provide clock signals at a predetermined frequency for driving the "on" counter. The circuitry of the "off" and the "on" timers 30, 32, respectively, preferably employs medium or large scale integrated circuitry. While both the "off" timer 30 and the "on" timer 32 might be designed for incorporation in a single integrated circuit chip, the availability of certain standardized oscillator/counter integrated circuit (IC) chips at relatively low cost affords a degree of design flexibility at relatively low cost. Accordingly, the "off" timer 30 and the "on" timer 32 are separate MOS IC chips, each being, for example, a MC14541B oscillator/counter manufactured and sold by Motorola.

A detailed block diagram of the oscillator/counter chip MC14541B used in each of the timers 30 and 32 is illustrated in FIG. 3. The pin numbers in FIG. 3 are similarly indicated within the boundaries of the respective timers 30, 32 in FIG. 2. The oscillator/counter chips 30 and 32 each include an oscillator 40 and a 16-stage counter formed by a pair of serially-connected 8-stage counters 41a and 41b respectively. The oscillator 40 provides clock signals to the clock input of the first counter stage 41a, via lead 42. The frequency of the oscillator 40 is determined by an externally connected RC time constant provided by a resistance connected to pin 1 and a capacitor connected to pin 2 of the particular oscillator/counter chip 30 or 32. With the availability of a large number of values of resistance and capacitance, the frequency of an oscillator 40 may be preselected to be of almost any value. In accordance with the present invention, the oscillator or clock source associated with the "off" timer 30 is independent of that associated with the "on" timer 32 in order that each might operate with a different time base or clock frequency. More specifically, in the illustrated embodiment the oscillator in the "on" timer 32 is of a constant frequency of about 54.6 Hz, as determined by the time constant of 182 kohm resistor 44 and 0.047 μ fd capacitor 45. A 1 megohm resistor 43 connected from the junction of resistor 44 and capacitor 45 to pin 3 has relatively little effect on the frequency.

On the other hand, the oscillator associated with the "off" timer 30 may have any one of three preselected clock frequencies, i.e., 6.07 Hz, 9.1 Hz or 18.2 Hz determined respectively by only 348 kohm resistor 46c in combination with the 0.22 μ fd capacitor 47, or by either 698 kohm resistor 46b or 174K ohm resistor 46a also in the combination. A 1 megohm resistor 48, similar to resistor 43 for the "on" timer, has relatively little effect on the frequency. Selection of the particular clock frequency is made via a selectable connection junction, generally represented as 49.

Considering further the oscillator/counter illustrated in FIG. 3, pin 8 provides the singular output from the counter 41a, 41b. However, due to a predetermined logic code applied to the terminals 12 and 13 and the use of gating logic, including the transmission gates 50 and the "one of three" multiplexer 51, it is possible to obtain the preselected output of counter-stage "8", "10", "13" or "16". In the illustrated embodiment, all 16 stages of counters 41a and 41b are utilized. Further, the logic level applied to pin 9 determines, via logic connected between the output of counters 41a, 41b and the output pin 8, whether the output signal appearing on that pin 8 reflects the Q or the Q* (logic inverse of Q) output of the counter. If pin 9 is connected to a logic 1 (ground), the output pin 8 represents the Q side of the counter; whereas if pin 9 is connected to a logic 0 (−15 volt), the pin 8 represents the Q* side of the counter output. Referring to FIG. 2, it will be noted that pin 9 of the "off" time counter 30 is effectively at a logic 1 whereas pin 9 of the "on" time counter 32 is effectively at a logic 0. The MASTER RESET pin 6 to the oscillator/counter serves to reset the oscillator 40 and the counter 41a, 41b whenever a logic 1 (ground) is applied thereto. So long as the logic 1 condition remains on the input pin 6, the oscillator 40 and counters 41a, 41b are held in their "zeroed" reset condition.

Additional logic in the oscillator/counter chip of FIG. 3 includes a Set-Reset flip-flop formed by cross-connected Nor gates 80 and 82. The output from counter 41b is extended, via multiplexer 51, to an input of Nor gate 80. A mode-control signal supplied to pin 10 is extended through an inverter 84 to an input of Nor gate 82. A signal from the MASTER RESET pin 6 is also extended to an input of Nor gate 82. When pin 10 is at a logic 1, the Set-Reset flip-flop of gates 80 and 82 is inoperative as such and only serves to pass the counter signal from multiplexer 51. On the other hand, when pin 10 is at a logic 0, as in the illustrated embodiment, the Set-Reset flip-flop 80, 82 must be in its "Reset" condition to pass a logic change in the output from counter 41b, but upon passing one such logic change then enters its "Set" condition where it remains until it is reset by a logic 1 input at the "MASTER RESET" pin 6.

Relatively conventional circuit elements, including diode 60, are included in the AC to DC rectification circuit block 27 which provides filtered, unregulated, DC voltage of approximately −24 volts. Similarly, conventional circuitry including zener diode 62 is included within the voltage regulating circuitry 28 for converting the unregulated DC voltage to a regulated −15 volts DC.

Referring to FIG. 2, the counter output appearing on pin 8 of the "off" timer 30 is extended, via lead 21', to the MASTER RESET input (pin 6) of the IC chip which forms the "on" timer 32. Correspondingly, the output of the counter in the "on" timer 32 is connected from pin 8 thereof, via lead 34, to the MASTER RESET input (pin 6) of the "off" timer 30. An RC delay network consisting of a series resistor 64 and a shunt capacitor 66 is connected to lead 21' to slightly delay the signal transmission from the "off" timer 30 to the "on" timer 32 to prevent a race condition.

Assuming a control protocol in which each 60 minutes of refrigeration circuit operation is to be followed by 10 minutes of defrost activity, the duty cycle timer 20 will be required to provide a duty cycle control signal on lead 21 in which the "off" interval is 60 minutes and the "on" interval is 10 minutes. Accordingly, resistor 46b will be operatively connected to pin 1 of "off" timer 30 to provide a 9.1 Hz clock signal which causes the output pin 8 from the 16 stage counter of the timer 30 to change state after approximately 60 minutes. Correspondingly, the 54.6 Hz clock signal associated with the "on" timer 32 will cause the output pin 8 of that timer to change state about 10 minutes after the counter in that timer is allowed to begin counting.

Figure 4:
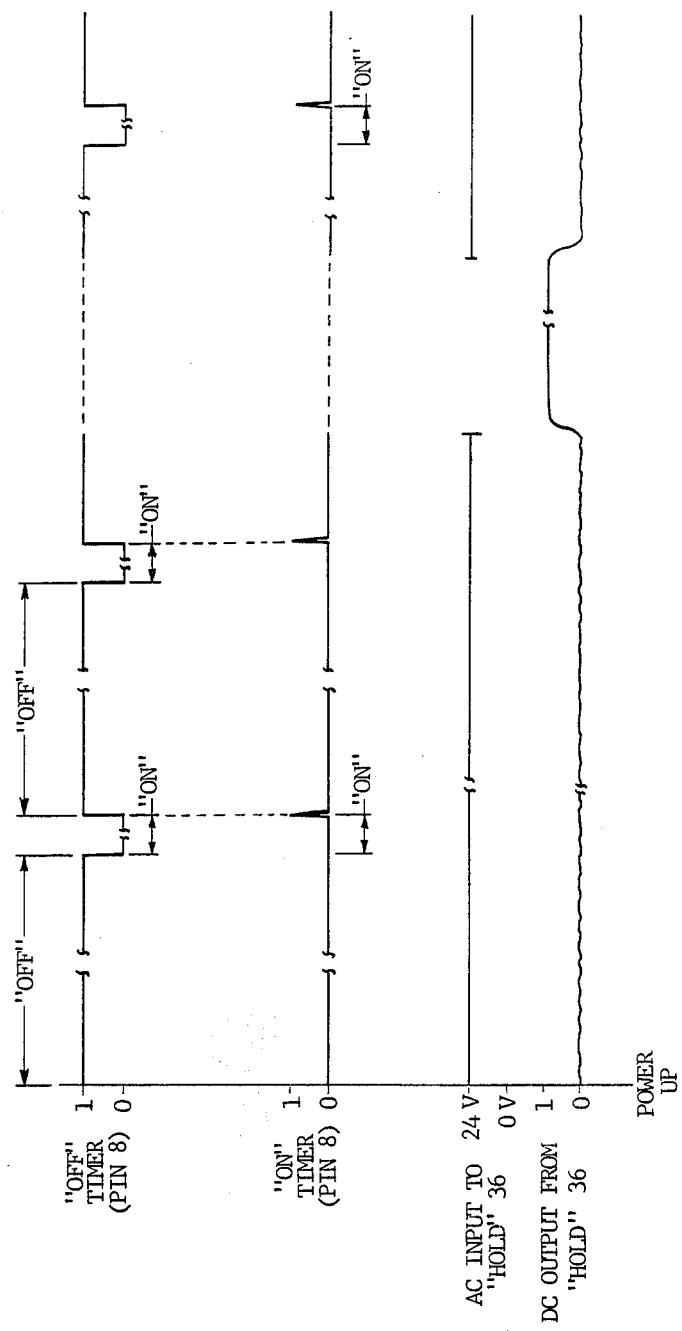
FIG. 4 is a waveform diagram for explaining the operation of the timer of FIG. 2.

Referring to the basic operation of the duty cycle timer 20 provided by the interconnection of the "off" timer 30 and the "on" timer 32, reference is made to FIG. 4 and particularly to the upper two waveforms illustrated therein. The uppermost waveform is designated '"OFF" Timer (PIN 8)', and in addition to being the output of the final operative stage of the counter in the "off" timer 30 also provides an accurate measurement of the "on" interval and thus constitutes the full duty cycle control signal appearing on lead 21. The next waveform therebelow is designated '"ON" Timer (PIN 8)', and reflects the signal extended from the final operative stage of the counter in the "on" timer 32 to the MASTER RESET input 6 of the "off" timer 30.

Upon initial power-up of the system, the output pin 8 of "off" timer 30 will be set to the logic 1 state, in part due to the connection of the pin 9 thereof to a logic 1 state (ground). On the other hand, because pin 9 of the "on" timer 32 is connected to the logic 0 potential, its output pin 8 appears as a logic 0 at power-up. It will be appreciated that the internal logic of the oscillator/counter circuit illustrated in FIG. 3 provides a reset signal not only on power-up, but also when pin 6 (MASTER RESET) receives a logic 1 signal. The reset condition serves to inhibit the oscillator 40 and to reset the counters 41a, 41b to a zero count and to maintain that condition so long as a logic 1 appears at pin 6. Thus, the signal at pin 8 of the "off" timer 30 remains at a logic 1 level until the final stage of the counter 41a, 41b changes state at approximately 60 minutes, whereupon it moves to the logic 0 state representative of the "on" interval.

During the "off" interval the MASTER RESET pin 6 to the "on" timer 32 will have been at a logic 1, thereby maintaining the counter in its reset condition. When the signal on line 21, 21' transitions to the logic 0 state, the "on" timer 32 begins to count. Following a 10 minute interval of counting, the final operative stage of the counter in the "on" timer will change state from a logic 0 to a logic 1, thereby signifying completion of the "on" interval. Because pin 8 of "on" timer 32 moves to the logic 1 state, it serves to reset the counters in "off" timer 30 as a result of the reset signal applied to pin 6 via line 34. At such time, one full "off" interval and one full "on" interval will have been completed.

As the "off" timer 30 is reset by the output from the "on" timer 32, its own output on pin 8 will move to a logic 1 which, via line 21', will serve to reset the "on" timer 32. The delay network of resistor 64 and capacitor 66 slightly delays transmission of this resetting signal on line 21' in order to prevent a race condition. Stable operation is ensured by allowing the pin 8 of the "on" timer 32 to remain at its logic 1 level for about 1 millisecond. It will be understood that even if the "off" interval is shorter than the "on" interval, the signal on line 21 from the "off" timer 30 will not change state from a logic 0 to a logic 1 when the "off" counter times out before the "on" counter times out, because the Set-Reset flip-flop 80, 82 of the "off" timer 30 will prevent it.

Referring to FIGS. 1 and 2, the "hold" circuitry 36 is operatively connected to or disconnected from a 24 volt AC signal via thermostat 35. The "hold" circuit 36 includes rectification and filtering circuitry comprised of a diode 70, a capacitor 72 and a resistor 74. The diode 70, capacitor 72 and resistor 74 are so connected that the voltage appearing at their common node 76 is a negative DC voltage of about −20 to −24V. Importantly also in the "hold" circuitry 36, there are provided a pair of diodes 77 and 78 having their anodes connected to the common node 76 and each having its cathode connected to pin 3 of a respective one of the "off" timer 30 and the "on" timer 32. The respective oscillator in each of the "off" and "on" timers 30, 32 will be inhibited by the presence of a logic 1 (or near logic 1) signal level appearing at its respective pin 3 input. Conversely, if the voltage level at the pin 3 is generally allowed to float with the oscillator, the respective oscillator serves to provide clock signals unless otherwise inhibited by a reset signal applied via pin 5 or 6.

Accordingly, the thermostat 35 will remain closed so long as a demand continues to be made on the refrigeration circuit. While the thermostat 35 is closed, the negative DC potential appearing on node 76 allows the cathodes of diode 77 and 78 to float, thus also allowing the pins 3 of "off" timer 30 and "on" timer 32 to float at a level sufficient to maintain the oscillators in their enabled state. On the other hand, when a temperature condition has been met by the refrigeration circuit, as sensed by opening of the thermostat 35, the potential appearing at node 76 of the "hold" circuitry 36 becomes substantially more positive, approaching the logic 1 level due to forward conduction from the ground potential through resistor 74 and through the diodes 77, 78 to their respective pins 3 on the timers 30, 32. Inasmuch as the pins 3 on the timers 30, 32 then also appear near a logic 1 level, their respective oscillators are inhibited and no further clock signals are provided to drive the respective counters. It is noteworthy, however, that the respective counters in timers 30, 32 continue to receive a supply potential and are not reset by the opening of the thermostat 35. Accordingly, the accumulated count in the timers 30, 32 is held until the thermostat 35 recloses and a demand is placed on the refrigeration circuit, whereupon the duty cycle timer 20 continues and completes the interval which was interrupted. This operation of the "hold" circuit 36 is illustrated in the lower two waveforms of FIG. 4, with the resulting effect on the operation of duty cycle timer 20 being illustrated in the uppermost two waveforms of that figure. It will be understood that if only one of the "off" and the "on" intervals is to be stopped and held by the "hold" signal, only one of the diodes 77 and 78 would be required, that one being connected to the pin 3 of the particular timer 30 or 32 which is to be "held" while the pin 3 of the other timer would be allowed to float.

Although the duty cycle timer of the invention has been illustrated and described in conjunction with the control of a defrost mechanism, it will be understood by those skilled in the art that the timer is suitable for controlling the operating duty cycle of a large variety of loads and that various changes in form and detail thereof may be made without departing from the spirit and scope of the claimed invention.

Having thus described a typical embodiment of our invention, that which is claimed as new and desired to secure by Letters Patent of the United States is:

1. An improved duty cycle timer for providing a duty cycle control signal, said duty cycle control signal having alternate "on" and "off" intervals of different logic states, said timer comprising:
   integrated circuit means including first clock signal generating means for generating a first frequency clock, second clock signal generating means for generating a second frequency clock independent of said first clock, first electronic counting means responsive to said first clock for measuring a predetermined one of said "on" and "off" time intervals and providing a signal representative of the completion thereof, and second electronic counting means responsive to said second clock for measuring the other one of said "on" and "off" time intervals and providing a signal representative of the completion thereof, said first and said second clock signal generating means each being responsive to a two-state "enable or hold" signal to respectively enable or inhibit operation of the respective said clock signal generating means, any count in said first and said second counting means remaining static during application of said "hold" signal thereto;

means for connecting a two-state "enable or hold" signal to said first and second clock signal generating means and having an input terminal adapted to have an AC voltage connected thereto and disconnected therefrom and including rectifying means operatively connected to a "hold" potential and to said first and said second clock signal generating means for applying an "enabling" DC potential to said clock signal generating means when said AC voltage is connected to said input terminal and for applying said "hold" potential to said clock signal generating means when said AC voltage is disconnected from said input terminal;

circuit means, including resetting circuitry, cross-connecting said first and said second electronic counting means in complementary relation for initiating said measurement of said "on" and said "off" time intervals respectively from a reset condition of the respective one of said first and said second electronic counting means in response to said signals representative of the completion of the preceding said "off" and "on" time intervals respectively; and wherein said duty cycle control signal is provided by at least one of said first and said second electronic counting means.

2. An improved duty cycle timer for providing a duty cycle control signal, said duty cycle control signal having alternate "on" and "off" intervals of different logic states, said timer comprising:

integrated circuit means including first clock signal generating means for generating a first frequency clock, second clock signal generating means for generating a second frequency clock independent of said first clock, first electronic counting means comprising a first multistage binary counter responsive to said first clock for measuring a predetermined one of said "on" and "off" time intervals and providing a signal representative of the completion thereof, and second electronic counting means comprising a second multistage binary counter responsive to said second clock for measuring the other one of said "on" and "off" time intervals and providing a signal representative of the completion thereof, said interval measured by said first electronic counting means being longer than said interval measured by said second electronic counting means and said signals representative of the completion of said "off" and said "on" time intervals being provided by the respective final operative stages of the respective said multistage counters;

circuit means, including resetting circuitry, cross-connecting said first and said second electronic counting means in complementary relation for initiating said measurement of said "on" and said "off" time intervals respectively from a reset condition of the respective one of said first and said second electronic counting means in response to said signals representative of the completion of the preceding said "off" and "on" time intervals respectively, each said multistage counter being reset by the application of a particular logic signal level to a respective reset input to the respective said counter, said counter being maintained in said reset condition while said particular logic signal level is maintained at said reset input, and wherein said cross-coupling of said first and second electronic counting means coupler the respective said signals representative of completion of said "off" and said "on" intervals to the respective said reset inputs of the respective said counters to thereby at least release said reset condition; and wherein said duty cycle control signal is provided by at least one of said first and said second electronic counting means.

3. The timer of claim 2 wherein said duty cycle control signal is provided by a predetermined stage of one of said multistage counters.

4. The timer of claim 3 wherein said first clock signal generating means and said first electronic counting means are incorporated in first integrated circuit means and said second clock signal generating means and said second electronic counting means are incorporated in a second integrated circuit means separate from said first integrated circuit means.

5. The timer of claim 3 wherein said predetermined stage of said multistage counter is the final operative stage thereof.

6. The timer of claim 5 wherein said duty cycle control signal is provided by said predetermined stage of said first counting means.

7. The timer of claim 2 including signal delay means, said signal delay means being included in said circuit means which cross-connect the final stage of said first counting means to said second counting means to inhibit any race condition between said first and said second counting means.

8. An improved defrost timer for providing a defrost timing control signal, said timing control signal having alternate "ON" and "OFF" intervals of different logic states, said timer comprising:

means including first and second different RC time constants for generating respective first and second electronic clock signals at rates different from and independent of each other, said clock signal generating means being responsive to a two-state "enable or hold" control signal for respectively enabling or inhibiting generation of said first and second clock signals by said electronic clock signal generating means;

electronic counting means responsive, in alternate succession, to the first clock for a first interval and to the second clock for a second interval to provide an output signal representative of an "OFF" interval during said first interval until a first predetermined count is reached and representative of an "ON" interval during said second interval until a second predetermined count is reached, said "ON" and said "OFF" time intervals respectively being initiated by the completion of the preceding "OFF" and "ON" time intervals respectively and said defrost timing control signal being provided by said output signal of said electronic counting means; and means for connecting a two-state "enable or hold" control signal to said clock signal generating means, so that said first and second clock signals are held frozen and any count in said electronic counting means remains static during application of said "hold" control signal to said clock signal generating means.

9. The timer of claim 8 wherein said predetermined count of said counting means is the same during each of said first and said second intervals.

10. The timer of claim 8 wherein said means for connecting a two-state "enable or hold" signal to said first and second clock signal generating means has an input terminal adapted to have an AC voltage connected thereto and disconnected therefrom and includes rectifying means operatively connected to a "hold" potential and to said first and said second clock signal generating means for applying an "enabling" DC potential to said clock signal generating means when said AC voltage is connected to said input terminal and for applying said "hold" potential to said clock signal generating means when said AC voltage is disconnected from said input terminal.

11. The timer of claim 8 wherein said electronic counting means comprises multistage binary counting means and said output signal is provided by a predetermined stage of said multistage counting means.

12. The timer of claim 11 further including switch means having a control electrode for controlling the flow of electrical current to a load device in response to said defrost timing control signal being applied to said control electrode, and means for connecting said defrost timing control signal to said control electrode.

13. The timer of claim 8 wherein at least one of said first and second RC time constants is adjustable for varying the rate of a respective one of said first and second clock signals.

14. The timer of claim 13 wherein said first RC time constant is adjustable for varying the rate of said first clock signal thereby to vary said "OFF" time interval.

* * * * *

UNITED STATES PATENT AND TRADEMARK OFFICE
CERTIFICATE OF CORRECTION

PATENT NO. : 4,745,629
DATED : May 17, 1988
INVENTOR(S) : Thomas W. Essig, Rajendra K. Shah It is certified that error appears in the above-identified patent and that said Letters Patent is hereby corrected as shown below:

Column 1, line 6, "386,935" should be --586,935--.

Column 2, line 30, delete "Disclosure of Invention".

Column 2, line 31, insert heading: --DISCLOSURE OF INVENTION--.

Column 4, line 34, "competion" should be --completion--.

Column 10, Claim 2, line 6, "coupler" should be --couples--.

Signed and Sealed this

First Day of October, 1991

Attest:

HARRY F. MANBECK, JR.

*Attesting Officer*   *Commissioner of Patents and Trademarks*